United States Patent
Vanderstraeten

[19]

[11] Patent Number: 5,853,816
[45] Date of Patent: Dec. 29, 1998

[54] METHOD OF COATING A SPUTTER CATHODE WITH A LAYER OF MATERIAL TO BE APPLIED TO A SUBSTRATE BY SPUTTERING

[75] Inventor: Johan Vanderstraeten, Drongen-Gent, Belgium

[73] Assignee: Emiel Vanderstraeten, Gent, Belgium

[21] Appl. No.: 794,058

[22] Filed: Feb. 4, 1997

Related U.S. Application Data

[60] Continuation of Ser. No. 310,420, Sep. 22, 1994, abandoned, which is a division of Ser. No. 92,115, Jul. 14, 1993, abandoned.

[30] Foreign Application Priority Data

Jul. 15, 1992 [BE] Belgium ................................ 09200664

[51] Int. Cl.⁶ ...................................................... C23C 4/04
[52] U.S. Cl. ........................ 427/452; 427/456; 204/298.13
[58] Field of Search ................................... 427/452, 456; 204/298.12, 298.13, 298.16, 298.21, 298.28, 192.23, 192.29

[56] References Cited

U.S. PATENT DOCUMENTS

| | | |
|---|---|---|
| 4,166,018 | 8/1979 | Chapin . |
| 4,209,375 | 6/1980 | Gates et al. . |
| 5,047,131 | 9/1991 | Wolfe et al. ........................ 204/192.23 |
| 5,332,601 | 7/1994 | Varacelle, Jr. et al. ................. 427/452 |
| 5,372,845 | 12/1994 | Rangaswamy et al. ................ 427/456 |

FOREIGN PATENT DOCUMENTS

| | | |
|---|---|---|
| 0115629 | 8/1984 | European Pat. Off. . |
| 0300995 | 1/1989 | European Pat. Off. . |
| 4015387A1 | 11/1991 | Germany . |

OTHER PUBLICATIONS

Thermal Spraying: Prachce, Theory, and Application, American Welding Society, 1985, p. 27. (no month date).

IBM Technical Disclosure Bulletin, vol. 22, No. 5, Oct., 1979, New York, USA; p. 1820, "Depositon of Silicon and Other Materials on Cathodes by Flame Spraying" by P.S. Grosewald, R.A. Holmwood, and F.M. Pressman.

Patent Abstracts of Japan, vol. 14, No. 334 (C–742) 18 Jul. 1990 & JP, A, 02 122 072 (Toyobo Co Ltd.) 9 May 1990.

*Primary Examiner*—Katherine A. Bareford
*Attorney, Agent, or Firm*—Lackenbach Siegel Marzullo Aronson & Greenspan, PC

[57] ABSTRACT

This invention is relating to a sputter cathode (1) with a layer of material that is applied to a substrate by sputtering, wherein this layer (3) contains low electrical conductivity particles (3a) of which a certain quantity are at least coated by a film (3b) of electrically conductive material, or which form an aggregate with a conductive material, so as to give this layer (3) sufficient electrical conductivity to be able to be applied to the substrate by means of sputtering.

18 Claims, 2 Drawing Sheets

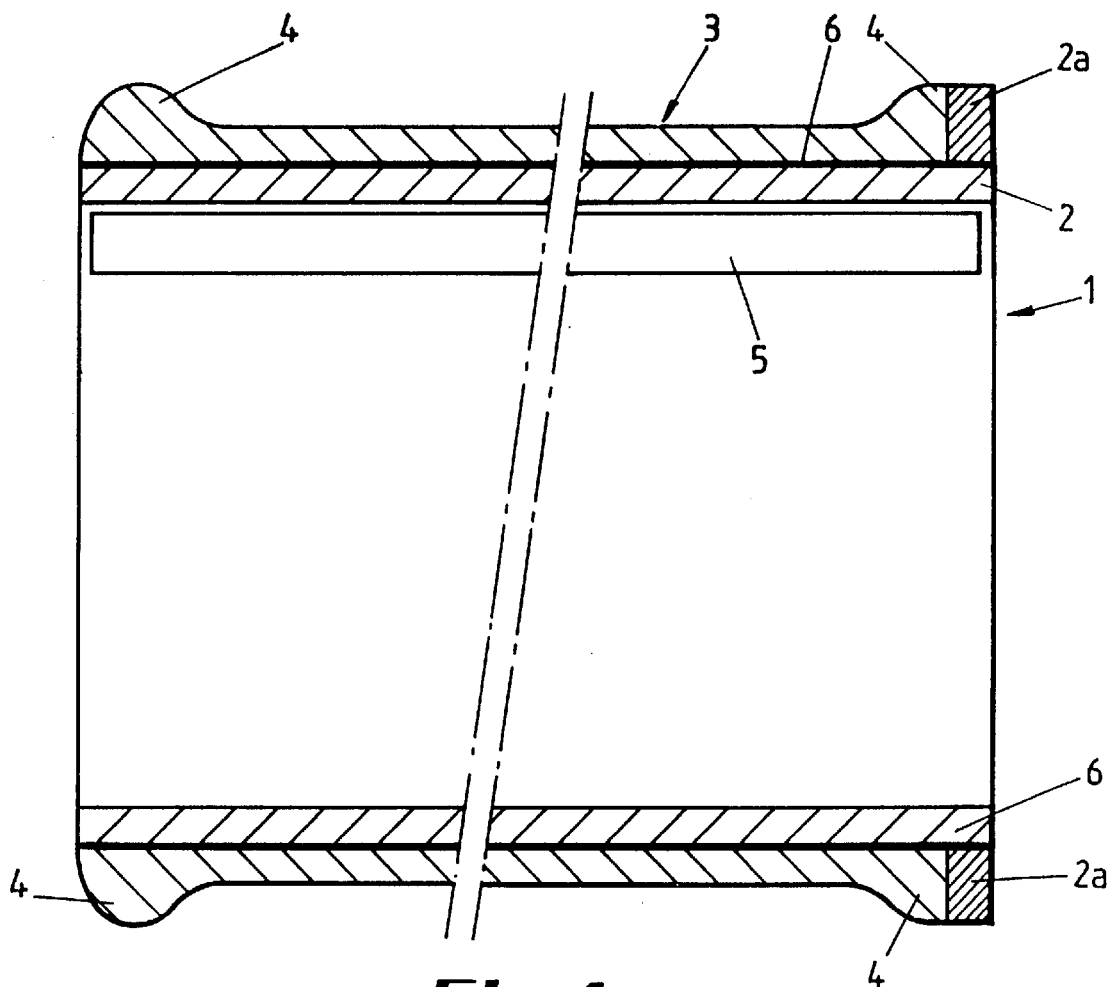
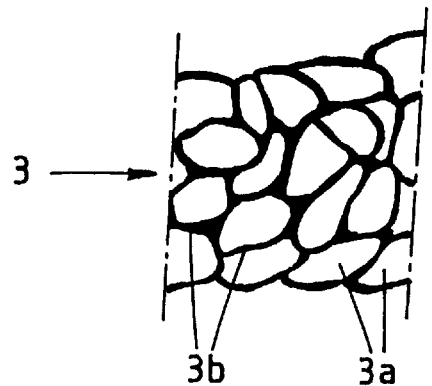

METHOD OF COATING A SPUTTER CATHODE WITH A LAYER OF MATERIAL TO BE APPLIED TO A SUBSTRATE BY SPUTTERING

This application is a continuation of application Ser. No. 08/310,420, filed Sep. 22, 1994, now abandoned, which is a Division of Ser. No. 08/092,115; filed: Jul. 14, 1993, now abandoned.

FIELD OF THE INVENTION

The invention concerns a sputter cathode with a layer of material to be applied to a substrate by means of sputtering.

BACKGROUND OF THE INVENTION

Sputtering is a well-known method of applying thin layers of metal to a surface of a substrate in a controlled atmosphere by means of gas-discharge at very high voltage—this is also called cathodic vaporation.

Positively charged ions, attracted by the high negative voltage of the sputter cathode, bombard the surface of the sputter cathode at a very high velocity and with great force so that surface atoms of this cathode are physically detached from the surface and leave this surface with great speed to collide with the surface of the substrate opposite, on which a film with very specific characteristics is accordingly formed.

The applications of this technique are numerous. An important application, for example, is the forming of a transparent and extremely thin metal oxide or nitride film on glass, that e.g. allows infrared rays to be reflected and is therefore very suitable for window panes which then reflect the heat of the sun. This concerns a so-called "LE film" (Low Emissivity) with low heat emission.

The filtering characteristics are obtained by a series of layers, three for example, with varying refractive indexes.

The sputtered layers or coatings can be of metal or ceramic. An important number of these optical coatings are made of a superposition of both.

Examples of metallic coatings are silver, gold, nickel-chromium, chromium, while examples of ceramic coatings are silicone oxide, siliconnitride, titanium oxide, titaniumnitride, zinc oxide, tinoxide.

Ceramic coatings are generally obtained by means of reactive sputtering. In this case, a metal is sputtered under oxidizing or nitrating conditions (oxygen or nitrogen rest atmosphere). This can be done with fixed plane or rotating cilindrical targets (cathodes). If the coating is of silicon, a supplementary problem arises because this element has a low electrical conductivity.

The advantages of rotating targets compared to fixed plane targets are that the sputtering layer is used homogeneous and completely, the sputtering velocity is higher and there are less problems of residue formation on the target when reactive sputtering is used. As to this last advantage, when reactive sputtering is used for forming a ceramic layer on a substrate, also a ceramic film is precipitated on the target. If a fixed plane target is used the thickness of this film is increasing continuously until the area or zones around and close to the sputtering track is completely insulated. This will have as a result that these zones will continuously be charged and discharged by arc forming, which can only be avoided by applying the low yield and expensive so called "RF sputtering". During "RF sputtering", the polarity is alternating, so that no charging can take place. This is less problematic when a rotating target is used because the formed oxide layer will be sputtered away together with fresh sputtering material at each rotation of the target.

If the target is made of silicon, aluminium will be added to increase the electrical conductivity of the sputtering layer. This conductivity is very important for preventing arc formation and for extinguishing quickly possible arcs on the surface of the sputtering layer. This conductivity is also important for enabling to activate the so called "arc-security" of the power supply of the sputtering device when such an arc arises.

In this respect, it is very important to obtain a sufficiently homogeneous distribution of the aluminium particles in the silicon particles. Indeed, otherwise the risk exists, due to a certain accumulation of the conductive particles, that at these places spontaneous electrical arcs originated, with consequences including the local melting of the aluminium that solidified as relatively large aluminium droplets on the surface of the anode.

SUMMARY OF THE INVENTION

The invention therefore has the objective of remedying these significant disadvantages, and to present a cathode with a layer of material that principally consists of low conductivity or non-conductive particles, that is nevertheless sufficiently electrically conductive to be able to be applied to a substrate by sputtering.

To archieve this objective, this layer of material contains low conductivity particles of which a certain quantity are at least partly coated by a conductive film, or form an aggregate with a conductive material to accordingly give this layer sufficient electrical conductivity to be able to be applied on the substrate by sputtering.

The particles mainly contain silicon and the conductive material is formed mainly from nickel.

In a special design form of the invention, the quantity of electrically conductive material forms 0.1 to 30% of the total quantity of material of the layer, according to the nature of the material used for the forming of the layer concerned and the intended applications.

The invention also concerns a method for the coating of a sputter cathode with a layer of material that is to be applied to a substrate by means of sputtering.

This method is characterised by the fact that one applies the likewise well-known metal spraying technique to project low conductive particles with an electrically conductive coating, or particles that form an aggregate with a conductive material onto an electrically conductive carrier. This carrier should preferably be low-magnetic or non-magnetic. Thus, a layer of material is formed on the carrier, which can be applied to a substrate by sputtering.

In a preferred design form of the method according to the invention, one makes use of a particles of low conductivity that are nickel-coated according to the "nickel carbonyl gas plating method".

In a more specific design form of this method, during the metal spraying, in the transverse section of the carrier and in the layer of material that is gradually applied to the latter, one maintains practically the same temperature gradient as that to which it is subjected during sputtering.

Other special aspects and advantages of the invention wil become apparent from the following description of a number of special design forms of the composition of the layer of material according to the invention, which are to be applied to a substrate by sputtering, from a method for the forming of this layer, as well as from a device for the application of this method; this description is only provided as an example and does not limit the scope of the invention. The reference numbers used below relate to the figures appended.

BRIEF DESCRIPTION OF THE DRAWINGS

FIG. 1 is a schematic transverse section of a sputter cathode according to a specific design form of the invention.

FIG. 2 is a schematic presentation on a larger scale of a detail of this sputter cathode.

Figure 3:
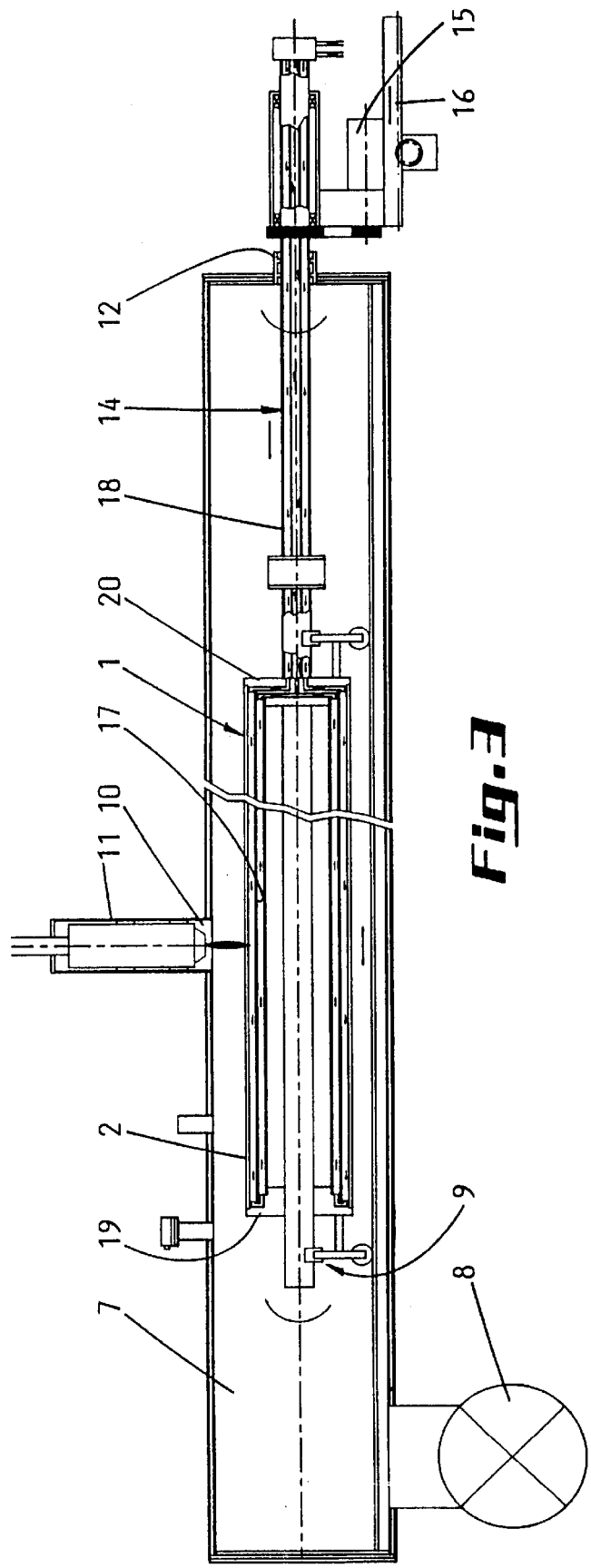
FIG. 3 is a schematic longitudinal section presentation of a device according to the invention for the manufacture of the sputter cathode concerned.

In these figures the same reference figures concern the same or analogous elements.

DESCRIPTION OF THE PREFERRED EMBODIMENTS

The sputter cathode according to the invention consists principally of a carrier of an electrical conductor, preferably of non-magnetic or low-magnetic material, of which the active side is coated with a layer of material that is to be applied to a substrate by means of sputtering. This layer principally consists of low conductivity particles that, before being applied to the carrier, are at least partly coated with an electrically conductive film of preferably a non-magnetic or low-magnetic material, or that have been converted to a preferably almost homogeneous aggregate with a conductive material, and this in such a way that when these particles are applied to the carrier in the form of a dense layer, i.e. with a minimum porousness, this layer shows sufficient electrical conductivity for it to be applied to the substrate by means of sputtering.

The low conductive material of these particles consists mainly of silicon, while the conductive material is preferably mainly formed of nickel.

In a more specific design form of the invention, the conductive material forms an extremely thin film around the non-conductive material, covering preferably at least 50% of the particles of low or non-conductive material so that when the particles are applied to the carrier of the sputter cathode in the form of a layer, an electrically conductive layer originates of which, moreover, the conductivity is also practically constant over the entire surface of the carrier which is coated with this layer.

Very good results were obtained when at least 80% of the particles of low conductivity material displayed a granular size of between 10 and 100 micron, and particularly when this granular size was between 20 and 75 micron.

According to the granular size, the conductivity desired, the nature of the conductive and non-conductive material as well as the applications considered, the quantity of the electrically conductive material varies with regard to the total quantity of material of the aforementioned layer. The quantity of the electrically conductive mterial usually forms 0.1 to 30% of the total quantity of material of the sputter material on the carrier of the cathode according to the invention. If, for example, the non-conductive material consists of silicon nitride, and the film to be formed on the substrate by sputtering must be as transparent as possible, the quantity of conductive material, that is formed of nickel for example, is preferably 0.1 to 5% of the total quantity of material.

This is f.i. the case if the film is made from silicon nitride, so as to avoid absorption by this film. This absorption can be provoked by the presence of metallic nickel in the film. If the film is of silicon oxide, also nickel oxide and nickel silicide will be formed, which is less problematic for absorption. Moreover, it seems that this combination will have an advantageous effect on the quality and durability of the coating. Therefore, if silicon oxide is used as the non-conductive material, for the same application, i.e. where a transparent film is to be formed, higher concentrations of conductive material can be used, up to, e.g. 10 to 20% of the total quantity of material.

For applications where the film does not have to be transparent, such as with environmentally-friendly packagings for example, the quantity of conductive material can amount to up to 30% of the total quantity of material.

In practice one preferably uses silicon powder of which the particles are coated with nickel according to the likewise well-known "nickelcarbonyl gas plating method", as used, for example, by Inco Ltd. for the coating of graphite powder with a nickel film.

Accordingly, the smallest possible quantity of nickel can be applied to the silicon powder. In general, this amounts to 1.3 to 1.5% nickel. To obtain a composition in the layer of material on the sputter cathode of e.g. 0.5% nickel, one metallizes with a homogeneous mixture of 1 part 1.3 nickel-coated silicon with 5 parts uncoated silicon. For layers with greater quantities of nickel, the point of departure is either a higher concentration of nickel-coated silicon with not coated silicon, or a smaller ratio between the quantity of coated and not coated silicon.

It is also important that the thickness of this sputtering layer is as great as possible to obtain the longest possible period of use of the sputter cathode. This thickness is preferably understood as between 2 and 8 mm, more specifically in the range of 3 to 5 mm.

In order to increase the efficiency of the sputter cathode, this is fitted, according to an individually recognised manner, with an electromagnet which is positioned on the side of the carrier opposite to the side where the sputter layer is provided.

With a drum-form sputter cathode this electromagnet is to be found inside the drum as close as possible to the interior wall of the latter, extended along the whole length of the drum. furthermore, this magnet is so positioned with regard to the drum that when the latter is subjected to a rotation movement on its shaft, the magnet remains stationary so that with the rotation of the drum, the inside of the latter moves as compared with this electromagnet.

Such a sputter cathode has been designed by "Aircocoating Technology" under the name "C-MAG Rotatable Magnetron Cathode".

In a more advantageous design form of the invention the thickness of the sputter layer on the drum is somewhat thicker in the proximity of the ends of the latter than on the intermediate surface. It has indeed been established that, with the sputtering, more material is used from the outer layer of the drum per time unit at the place opposite the ends of the electromagnet than from the intermediate area of the layer. In the longitudinal direction of the drum, this thickening preferably has a cross section in the form of a Gauss curve, while the maximum height of this thickening is between 30 and 60% of the thickness of the centrally situated part of this layer.

Another method to enable a more even consumption of the layer along the entire length consists of using a magnetic underlayer at these ends, such as nickel or iron allows, in order to reduce, re-modulate and/or spread out the magnetism in this zone and accordingly reduce the sputter speed.

Such a drum-formed sputter cathode is presented in FIG. 1, whereby number 2 indicates the wall of the drum 1, 3 indicates the outer side with the applied sputter layer, and 4 indicates the ring-form thickening at both ends of the drum 1 opposite the ends of the electromagnet 5.

In the context of this description and of the invention, "sputter layer" is understood as: a layer on the outside of the sputter cathode; subsequently, in an entirely separate process, the material that forms this layer is transferred in the form of a film onto a random substrate—e.g. a glass plate—by sputtering.

Neither is the invention limited to a sputter cathode 1 with thickening 4 at its ends, but it also extends to a cathode of which the layer 3 has practically a uniform thickness along its whole surface.

This drum is constructed of an electrically conductive, preferably non-magnetic or low magnetic material such as rustproof steel, copper, aluminium or on basis of titanium.

A first special and highly interesting design according to the invention is the combination of a titanium-based carrier with silicon layer, and this for the following reasons. In addition to the good mechanical properties, good electrical conductivity and non-magnetic properties, titanium has the advantage of having a very small coefficient of expansion, namely $9.4 \times 10^{-6}$. For information it can be noted that for silicon the coefficient of expansion is $4 \times 10^{-6}$ and for rustproof steel $18 \times 10^{-6}$. It is evident that in view of the substantial thermal load during sputtering, the titanium-silicon combination has very great advantages, including less crack formation and the possibility of forming greater thicknesses.

The titanium used can be any commercially available product. Tests were conducted with the following sorts:

|          |          | Composition |      |         | Coefficient |
|----------|----------|------|------|---------|-------------|
| DIN 1746 | DIN 1700 | % Fe | % O  | % Pd    | of expansion |
| 37025    | Ti I     | 0.2  | 0.10 | —       | $9.4 \times 10^{-6}$ |
| 37035    | Ti II    | 0.25 | 0.20 | —       | $9.4 \times 10^{-6}$ |
| 37235    | Ti IIPd  | 0.25 | 0.12 | 0.12/0.15 | $9.4 \times 10^{-6}$ |

Other non-magnetic metals or alloys, more specifically titanium alloys with a coefficient of expansion of less than $12 \times 10^{-6}$ and preferably less than $10 \times 10^{-6}$, can also be applied in an advantageous manner.

A second interesting design is an aluminium carrier. Although this material has an unfavourable coefficient of expansion, it has the advantage, in the same way as copper, to have a good thermic conductivity. This will have as a result that it will be possible to cool the carrier much easier so that the expansion will be less problematic.

Particularly, when the drum consists of copper or a copper alloy, between the drum and the sputter layer, an intermediary layer 6 of tin, of nickel or of a nickel-aluminium alloy is preferably applied in order to ensure the better adhesion of the sputter layer 3 on the wall 2 of the drum-formed cathode 1. Such an intermediary layer 6 can also be useful for a rustproof steel drum.

Furthermore, according to the invention, it can be of importance when the drum is of copper to subject this to a preliminary treatment due to the copper oxide that can be present on the surface.

This treatment can consists of applying electrochemical nickel or chemical nickel to the drum. The chemical nickelling can, e.g. be effected by the so-called "Kanigen process" according to which the drum is immersed in a cold bath of a nickel compound.

Then, an adhesion layer 6 of Ni—Al is preferably applied which contains e.g. 9% Al. Should the drum be of rustproof steel, this adhesion layer 6 can be applied directly to the drum without the preliminary treatment.

At a subsequent stage a so-called damping layer can be applied. This has as its main objective the avoidance of too significant voltages originating in the sputter layer 3 defined above. This damping layer can be of a variety of natures. It may display a certain porosity, ductility and/or elasticity. A zinc layer has the last two properties, for example.

Another possibility consists of providing a so-called "degradient layer", which consists of a multiple of consecutive sublayers, each with a smaller coefficient of expansion than the previous one. More specifically, the bottom sublayer may principally contain metal, while the following layers progressively contain less metal and more silicon.

In a special design form of the invention the drum is sprayed with a 50/50 mixture of aluminium/stainless steel to a thickness of 0.3 mm. Subsequently, the aluminium is pickled away to obtain an extremely porous structure, such as with a porosity of approximately 50%, thereby creating a compensation layer between the silicon and the stainless steel.

With another design form of the invention a fibrous mat of stainless steel is applied to the stainless steel layer. This concerns an individually recognised product of which the porosity is practically 80% and which is usually used as a filter. This mat is preferably formed from stainless steel fibres sintered to each other. The thickness of the mat is 0.4 mm, while the diameter of the fibres is 0.02 mm. This mat is folded around the drum and kept in place by a wire of 0.5 mm. Then the entity is sprayed with the layer 3. With this special design form the entity is subsequently sintered at a temperature of 1050° C. for 6 hours.

In FIG. 2 the structure is schematically presented of a certain design form of the sputter layer 3. This consists of silicon granules 3a that are coated with a film of conductive material 3b, resulting in perfect electrical conductibility through this layer 3. It is not usually required for all silicon granules 3a to be coated. furthermore, for the forming of this sputter layer 3 by metal spraying, more particularly flame spraying, use can be made of a mixture of non-conductive particles fully or partially coated with a conductive material, and not coated non-conductive particles. In some cases, instead of coated particles, use can be made of non-conductive particles to which conductive particles are attached. On account of the high temperature during the metal spraying process, the conductive particles can then melt and form a film around the non-conductive particles.

Good results have been obtained by combining silicon particles with 2 to 10% of very fine aluminium powder, very thin pellets or flakes of which f.i. at least have a size smaller than 10 microns and even smaller than 5 microns, as used in the painting industry. Also the combination of silicon particles with nickel flakes can advantageously be used, such as nickel flakes known under the trade mark "Novamet" type HCA-1, which is a conductive pigment with an average thickness of about 1 micron.

For the application of the layer 3 on the wall 2 of the drum 1 one preferably uses the individually recognised metal spraying technique, which involves the projection onto the electrically conductive wall 2 of the drum 1 of low-conductive particles coated with a electrically conductive film, or of low-conductive particles that form an aggregate with a conductive material; this projected material forms a layer 3 that can be applied to a substrate, such as pane glass, by sputtering.

This metal spraying process is carried out in an advantageous manner in a practically oxygen-free space, a vacuum for example, using a plasma gas of argon and hydrogen.

This metal spraying is also preferably carried out under a controlled pressure of between 150 and 1500 millibar.

Very good results have been obtained by making use of silicon particles coated with a nickel film, of which at least 80% have a granular size of 10 to 100 micron, and preferably between 20 and 75 micron. A distinct preference is obviously made for particles that are all of the aforementioned granular size.

After forming the sputter layer 3 on the drum 1 (target) a protecting ring 2a is preferably provided or formed at both ends of the latter or the layer 3 of which the electrical conductivity is substantially different from the conductivity of the layer 3 itself. This ring 2a is generally located at about 10 mm from the effective sputter zone. It has to be noted that both ends of the drum are very sensitive to arcing because they are not continuously cleaned during sputtering. This ring 2a can be made of a conductive metal, which is formed of a separate piece fixed on the ends of the drum 1 or is obtained by metal spraying. Very good results have been obtained with titanium and stainless steel. Also aluminium can be used. Moreover, it will also be possible to use a ring 2a of electrically insulating or non conductive material, such as aluminium oxide. This material can be applied as a relatively thick layer of about 0,3 mm. It is further important that if a conductive ring 2a is used, this ring 2a is in closely contact with the conductive wall 2 of the drum, while if a non conductive ring is used the latter can be applied on the layer 3 or thickening 4.

In order to avoid the cracking of the sputter layer 3 with use of the sputter cathode, according to the invention, during the application of this layer in the transverse section of this wall and of layer 3, which one gradually forms on the wall, one retains practically the same temperature gradient as that to which the cathode will be subjected to during sputtering.

According to the invention one keeps the inner side of the wall 2 at a constant temperature during the metal spraying, for example between 10° and 80° C., preferably by means of water.

In FIG. 3 a schematic presentation is provided of a device which is exceptionally suited to the application of the method, according to the invention, for the coating of drum-form sputter cathodes with a layer of material that is to be applied to a substrate by means of sputtering.

This device consists mainly of a sealed chamber 7 to which a vacuum pump 8 is connected, and in which a trolley or carriage 9 is mounted to move to and fro opposite the burner outlet 10 of the metal spraying equipment 11 that is connected to chamber 7.

On this moveable trolley or carriage 9 the drum-form carrier 1 for a sputter cathode can be mounted rotatable on its shaft. The driving of this drum-formed carrier 1 on its shaft is effected by means of a drive rod 14 which is in line with the shaft of the drum formed carrier 1 and passes through seal 12, situated in the side wall of the sealed chamber 7. On the part of the rod 14 protruding from this wall, a drive motor 15 is mounted, possibly via a reduction box, that accordingly allows the drum-formed carrier 1 to rotate on its shaft. This motor 15 is in turn mounted, in the same way as carriage 9, on a moveable frame 16. Hence, during the metal spraying the carrier 1 is able to move to and fro in line with its shaft, while rotating around the latter.

Furthermore, inside the drum-formed carrier 1 a cylinder 17 is fitted coaxially with this drum-formed carrier, so as to form a double wall in which cooling water can be introduced. This cylinder is connected axially to a supply pipe 18 for water, which in a preferred design form can be formed by the rod 14 itself and which therefore, in this case, consists of a hollow cylinder-shaped pipe. The water supplied at the end of this cylinder 17 leaves the latter at its opposite end in the drum, to then flow along the inside of the wall 2 of the drum in the opposite direction to be discharged via a side discharge opening. For this, the drum is sealed watertight at its two ends by two circular discs 19 and 20, with which the drum 1 is therefore mounted rotatable on its shaft on the trolley or carriage 9. To further illustrate the invention, two concrete examples of the production of a sputter cathode according to the invention are provided.

EXAMPLE 1

In this example use is made of a cylindrical pipe of stainless steel as a carrier for the rotating sputter cathode.

As a first process the pipe was sandblasted and subsequently coated with a layer of nickel-aluminium alloy 91% nickel-9% aluminium. A next step consisted of applying silicon particles which have been coated with a nickel film to the outer wall of the pipe-shaped carrier using the technique of plasma spraying. Here use was made of particles of which the quantity of nickel in relation to the quantity of silicon amounts to 2.5%. The flame spraying was effected in a plasma gas that consisted of a mixture of argon and hydrogen with proportions of 40% hydrogen and 60% argon, while the residual atmosphere was composed of practically pure nitrogen. The pressure in chamber 7 was approximately 120 millibar.

During the plasma spraying the pipe-shaped carrier 2 undergoes a rotation on its shaft at the same time moving to and fro in line with its shaft and this while the inner side is heated to approximately 60° C. by warm water, so that the temperature of the pipe-shaped carrier is a maximum of 70° C.

At the moment of the thickness of the layer formed by the metal spraying of nickel-coated silicon particles amounting to approximately 2 to 4 mm along the entire surface of the outer side of the wall 2, the metal spraying is stopped, as is the rotary movement of the sputter cathode.

EXAMPLE 2

In this second example use was made of a copper pipe as a carrier for the sputter cathode. This pipe was first sandblasted with a granulate of 120 micron and subsequently chemically nickelled to obtain a film thickness of 10 micron. Subsequently, this nickel layer was again sandblasted, this time with a granulate of 60. Then followed the formation of the sputter layer of silicon particles coated by nickel in the same way as in example 1. In this design form no thermal treatments were applied.

The invention is in no way restricted to the design forms described above, and within the framework of the invention a number of changes can be considered, including changes concerning the nature of the material from which the non-conductive or low conductivity particles are formed, or the electrically conductive material with which the non-conductive or low conductivity particles are treated.

Furthermore, this electrically conductive material, instead of in the form of a film, can form an intimate aggregate as extremely small particles with the non-conductive particles of matter, that can be applied, for example, by metal spraying or another technique in the form of a solid and dense layer on the carrier of a sputter cathode.

It is also important for the porosity of this layer to be kept to the strict minimum.

In general, good results were obtained when use was made of low electrical conductivity particles which were coated by an electrically conductive film, which consisted of a material with a melting point in the same range as that of the material from which the particles are formed, while the eventual intermediary layer preferably has a melting point that is somewhat lower than that of the sputter layer itself.

The metal spraying referred to hereinabove consists in fact generally of a flame spraying.

What I claim is:

1. A method for coating of a sputter cathode with a layer of material that is to be applied to a substrate by means of sputtering, said method comprising the steps of:
    a) forming conductive particles consisting of silicon particles coated with a conductive film selected from the group consisting of aluminum, nickel and an aluminum-nickel alloy; and
    b) vacuum plasma-metal spraying said particles on to an electrically conductive carrier to form a layer of material that can be applied to a substrate by means of sputtering.

2. A method according to claim 1, wherein said vacuum plasma spraying is effected in a gas with a pressure of 150 to 1500 millibar.

3. A method according to claim 2, wherein said vacuum plasma spraying is effected in a substantially oxygen free condition.

4. A method according to claim 3, wherein said vacuum plasma spraying is effected with a plasma gas of argon and hydrogen in a nitrogen residual pressure.

5. A method according to claim 4, wherein said vacuum plasma spraying is effected in a vacuum.

6. A method according to claim 3, wherein said vacuum plasma spraying is effected in a pressure consisting of at least less than 0.05% partial pressure of oxygen by volume.

7. A method vacuum to claim 1, wherein at least 80% of said silicon particles have a granular size of 10 to 100 microns.

8. A method according to claim 7, wherein said silicon particles have a granular size of 20 to 75 microns.

9. A method according to claim 1, wherein said silicon particles are mixed with 2 to 10% of aluminum powder, thin pellets or flakes of which at least 80% have a size from between 5 microns to 10 microns, and/or with nickel flakes having an average thickness of about 1 micron.

10. A method according to claim 1, wherein the surface of said electrically conductive carrier is initially coated with an intermediate layer prior to applying said vacuum plasma sprayed material thereon.

11. A method according to claim 10, wherein said intermediate layer is applied to an outer circumferential surface of the electrically conductive carrier, and said intermediate layer having a melting point lower than that of said vacuum spray material.

12. A method according to claim 11, wherein said intermediate layer is selected from the group consisting of tin, aluminum, and nickel-aluminum alloys.

13. A method according to claim 1, wherein during said vacuum plasma spraying, of said electrically conductive carrier in a transverse direction, said vacuum plasma sprayed material that is applied to said carrier during the vacuum plasma spraying process is at a temperature gradient which is substantially the same temperature gradient obtained during the sputtering process.

14. A method according to claim 13, wherein said vacuum sprayed layer is applied to an outer cylindrical surface of said electrically conductive carrier, while said inner wall thereof is cooled.

15. A method according to claim 1, wherein said electrically conductive carrier has a thickness of between 2 mm and 5 mm and a temperature is maintained of between 10° and 80° C. during said vacuum plasma spraying for a side of said carrier opposite to the side on which said layer of material is to be applied.

16. A method according to claim 15, wherein said side is fluid cooled during said vacuum plasma spraying.

17. A method according to claim 1, wherein said sputter cathode is subjected to a thermal after treatment in a vacuum after said vacuum plasma sprayed layer has been applied.

18. A method according to claim 17, wherein said thermal after treatment is effected at a temperature between 400° and 1100° C.

* * * * *